United States Patent
Lin

(10) Patent No.: US 9,619,058 B2
(45) Date of Patent: Apr. 11, 2017

(54) CIRCUIT CONFIGURATION OF A TOUCH PANEL CONTROLLER IC

(71) Applicant: eGalax_eMPIA Technology Inc., Taipei (TW)

(72) Inventor: Po-Chuan Lin, Taipei (TW)

(73) Assignee: eGalax_eMPIA Technology Inc., Taipei (TW)

( * ) Notice: Subject to any disclaimer, the term of this patent is extended or adjusted under 35 U.S.C. 154(b) by 0 days.

(21) Appl. No.: 14/581,174

(22) Filed: Dec. 23, 2014

(65) Prior Publication Data

US 2015/0185952 A1    Jul. 2, 2015

(30) Foreign Application Priority Data

Dec. 31, 2013  (TW) .............................. 102149328 A

(51) Int. Cl.
*G06F 3/041*      (2006.01)

(52) U.S. Cl.
CPC .... *G06F 3/041* (2013.01); *G06F 2203/04103* (2013.01); *H01L 2224/05554* (2013.01); *H01L 2224/48247* (2013.01); *H01L 2224/49171* (2013.01)

(58) Field of Classification Search
CPC ................... G06F 3/041; G06F 3/0416; G06F 2203/04103; H01L 2224/48247; H01L 2224/49171; H01L 2224/05554
USPC ..... 345/173; 257/42, E21.508; 711/164, 200
See application file for complete search history.

(56) References Cited

U.S. PATENT DOCUMENTS

| | | | | |
|---|---|---|---|---|
| 5,603,008 A | * | 2/1997 | Hilton | G06F 12/1027 711/164 |
| 5,843,798 A | * | 12/1998 | Matsuda | H01L 24/11 257/E21.508 |
| 9,377,905 B1 | * | 6/2016 | Grivna | G06F 3/044 |
| 2002/0027444 A1 | * | 3/2002 | Jones | G01R 1/06744 324/756.04 |
| 2007/0288930 A1 | * | 12/2007 | Yim | G06F 9/485 718/107 |
| 2008/0054875 A1 | * | 3/2008 | Saito | A61B 5/1172 324/71.5 |
| 2009/0196086 A1 | * | 8/2009 | Pelley | H01L 23/49827 365/63 |

(Continued)

*Primary Examiner* — Prabodh M Dharia
(74) *Attorney, Agent, or Firm* — Muncy, Geissler, Olds & Lowe, P.C.

(57) ABSTRACT

A circuit configuration for touch panel controller IC includes a substrate including electrode pins arranged along four border edges thereof for signal transmission, and a controller mounted on the substrate and surrounded by the electrode pins and including processing units arranged in one same direction in a parallel manner, electric contacts arranged in three rows at three sides around the processing units and respectively electrically connected to the electrode pins of the substrate by respective lead wires and steering wires respectively electrically connected between the processing units and the electric contacts. Arranging the processing units in one same direction in a parallel manner minimizes differences in environmental conditions in exposure graphic definition and etch rate, thereby obtaining better circuit component process uniformity, and thus, the variation among the processing units after fabrication can be insignificant and better sensing accuracy can be achieved.

10 Claims, 5 Drawing Sheets

(56) References Cited

U.S. PATENT DOCUMENTS

| | | | | |
|---|---|---|---|---|
| 2010/0306496 | A1* | 12/2010 | Kobori | G06F 15/8046 711/200 |
| 2012/0050231 | A1* | 3/2012 | Westhues | G06F 3/03545 345/179 |
| 2012/0146016 | A1* | 6/2012 | Park | H01L 23/481 257/42 |
| 2012/0182259 | A1* | 7/2012 | Han | G06F 3/044 345/174 |
| 2013/0060306 | A1* | 3/2013 | Colbauch | A61N 5/0618 607/88 |
| 2013/0063916 | A1* | 3/2013 | Hankofer | H05K 3/301 361/767 |
| 2013/0338811 | A1* | 12/2013 | Zhang | G05B 19/4184 700/111 |
| 2014/0093881 | A1* | 4/2014 | Sugnet | H03M 7/30 435/6.12 |
| 2014/0198265 | A1* | 7/2014 | Li | G06F 3/0416 349/12 |
| 2014/0285469 | A1* | 9/2014 | Wright | G06F 3/044 345/174 |
| 2014/0313169 | A1* | 10/2014 | Kravets | G06F 3/044 345/178 |
| 2014/0327644 | A1* | 11/2014 | Mohindra | G06F 3/044 345/174 |
| 2014/0362053 | A1* | 12/2014 | Holmgren | G06F 3/0421 345/175 |
| 2015/0103043 | A1* | 4/2015 | Hills | G06F 3/044 345/174 |
| 2015/0301180 | A1* | 10/2015 | Stettner | G01S 17/107 356/5.01 |
| 2016/0017268 | A1* | 1/2016 | Kim | C12M 23/12 435/287.1 |
| 2016/0026250 | A1* | 1/2016 | Eriksson | G06F 3/0421 345/175 |
| 2016/0098147 | A1* | 4/2016 | Hills | G06F 3/044 345/174 |
| 2016/0099260 | A1* | 4/2016 | Chang | H05B 37/00 257/386 |

* cited by examiner

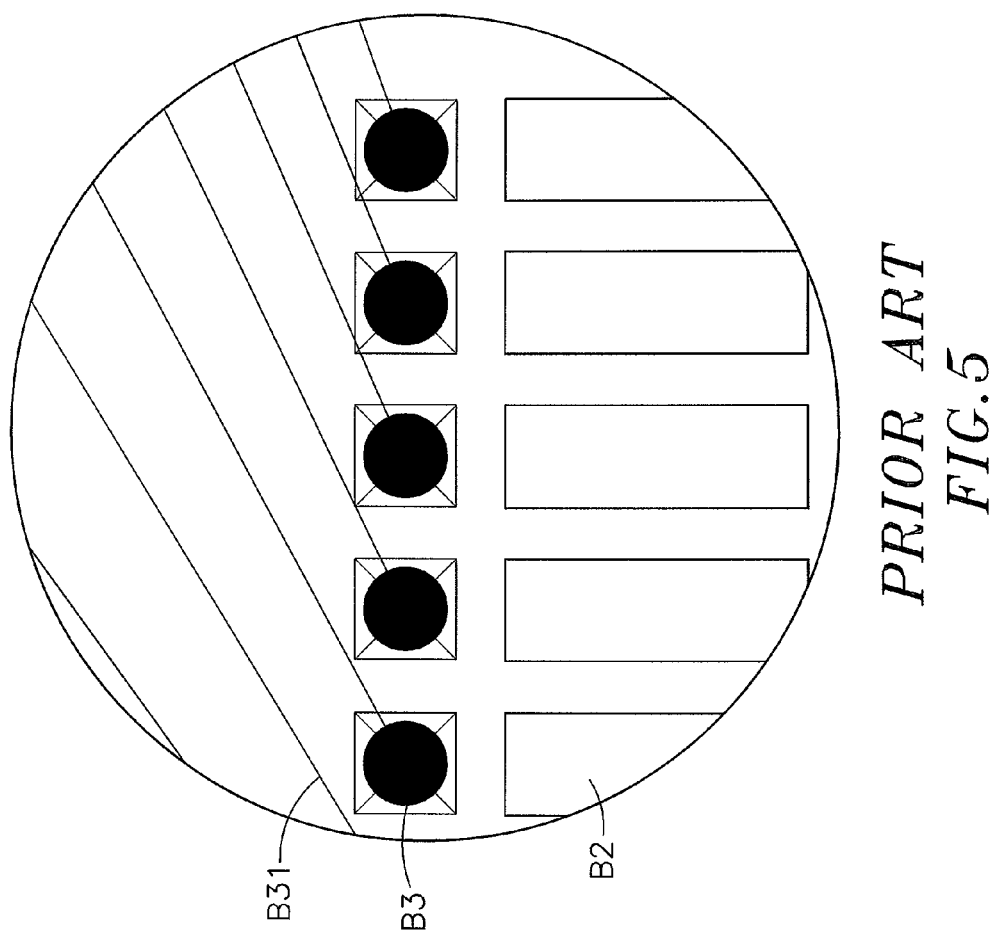

CIRCUIT CONFIGURATION OF A TOUCH PANEL CONTROLLER IC

This application claims the priority benefit of Taiwan patent application number 102149328, filed on Dec. 31, 2013.

BACKGROUND OF THE INVENTION

1. Field of the Invention

The present invention relates to circuit configuration technology and more particularly, to a circuit configuration for touch panel controller integrated circuit ("IC"), comprising a plurality of processing units arranged in one same direction in a parallel manner, which enables differences in environmental conditions in exposure graphic definition and etch rate to be minimized so that better circuit component process uniformity and a high level of sensing accuracy can be obtained.

2. Description of the Related Art

At the present time, screen sizes of touch-enabled devices grow larger. In order to obtain better sensing effects, a high sensing point density must be maintained. Increasing the sensing point density relatively increases the number of signal transmission channels. In consumer electronic devices, a touch panel is incorporated into a display screen. To meet consumer demand for visual enjoyment and spatial utilization, consumer electronic products are commonly designed to provide a narrow bezel, limiting the installation space for circuit board and related control IC. Therefore, the length-to-width ratio of a controller IC package substrate must be increased to fit a narrow bezel design. However, it is complicated to design a circuit configuration for touch panel controller IC under the restrictions of limited installation space, signal transmission channel requirement and chip electrode arrangement to match pin arrangement.

FIG. 4 illustrates circuit configuration for touch panel controller IC according to the prior art. According to this prior art design, the circuit configuration comprises a substrate A, and a chip B mounted on the substrate A. The chip B comprises a plurality of processing units B1 classified as first processing units B11 and second processing units B12. The first processing units B11 are arranged in a transverse row at the center area of the chip B, and respectively extend in longitudinal direction. The second processing units B12 are arranged in two longitudinal rows at opposing left and right sides relative to the first processing units B11, and respectively extend in transverse direction. The processing units B1 are respectively electrically connected to respective input/output units B2, which are respectively electrically connected to equally spaced electric contacts B3 that are respectively electrically connected to respective electrode pins C at the border area of the substrate A around the chip B by respective lead wires B31. Thus, the electrode pins C allow input of sensing signals from an external touch screen into the processing units B1 for processing.

In actual application, the aforesaid prior art circuit configuration for touch panel controller IC has drawbacks as follows:

1. Because the first processing units B11 and the second processing units B12 are arranged at different locations in different directions, differences in environmental conditions (such as angle or distance) in exposure graphic definition and etch rate during fabrication of the touch-panel controller IC are significant, in consequence, the variation between the first processing units B11 and the second processing units B12 after fabrication can be significant, affecting sensing accuracy.

2. Because the first processing units B11 and the second processing units B12 are arranged at different locations in different directions, the electric contacts B3 corresponding to the first processing units B11 are arranged close to one another, however, the respective electrode pins C are arranged at a relatively larger pitch. During wire bonding, the lead wires B31 are straightly extended from the electric contacts B3 to the electrode pins C. Due to narrow bezel design, the width of the substrate A is narrowed. Thus, as shown in FIG. 5, most lead wires B31 have a large skew angle. After being bonded, the lead wires B31 are disposed in proximity to respective adjacent electric contacts B3 or electrode pins C. Therefore, some lead wires B31 may be erroneously pressed over adjacent electric contacts B3 or electrode pins C, causing a short circuit and resulting in defective products and lowering the yield.

SUMMARY OF THE INVENTION

The present invention has been accomplished under the circumstances in view. It is therefore the main object of the present invention to provide a circuit configuration for touch panel controller IC, which enables differences in environmental conditions in exposure graphic definition and etch rate to be minimized so that better circuit component process uniformity and a high level of sensing accuracy can be obtained.

To achieve this and other objects of the present invention, a circuit configuration for touch panel controller IC of the present invention comprises a substrate and a controller. The substrate comprises a plurality of electrode pins arranged along four border edges thereof for signal transmission. The controller is mounted on the substrate and surrounded by the electrode pins, comprising a plurality of processing units arranged in one same direction in a parallel manner, a plurality of electric contacts arranged in three rows at three sides around the processing units and respectively electrically connected to the electrode pins of the substrate by respective lead wires, and a plurality of steering wires respectively electrically connected between the processing units and the electric contacts. Because the processing units are arranged in one same direction in a parallel manner, differences in environmental conditions (such as angle or distance) in exposure graphic definition and etch rate can be minimized, obtaining better circuit component process uniformity, and thus, the variation among the processing units after fabrication can be insignificant. After signal processing, the processing units can produce sensing signals in a consistent manner, enhancing sensing accuracy.

Further, because the processing units are arranged in the same direction in a parallel manner in the form of a rectangular array that defines opposing front and rear sides and opposing left and right sides, and the electric contacts are arranged in three rows at three sides around the processing units, the electric contacts can be arranged at a pitch larger than the pitch of the processing units, and thus, the skew angle required for wire-bonding respective lead wires to the electrode pins can be minimized, avoiding erroneous contact between one lead wire and any other adjacent electric contact or electrode pin and further occurrence of short circuits and production of defective products, and therefore, the invention facilitates fabrication and improves the yield.

BRIEF DESCRIPTION OF THE DRAWINGS

FIG. 5 is an enlarged view of a part of FIG. 4.

DETAILED DESCRIPTION OF THE PREFERRED EMBODIMENT

Figure 1:
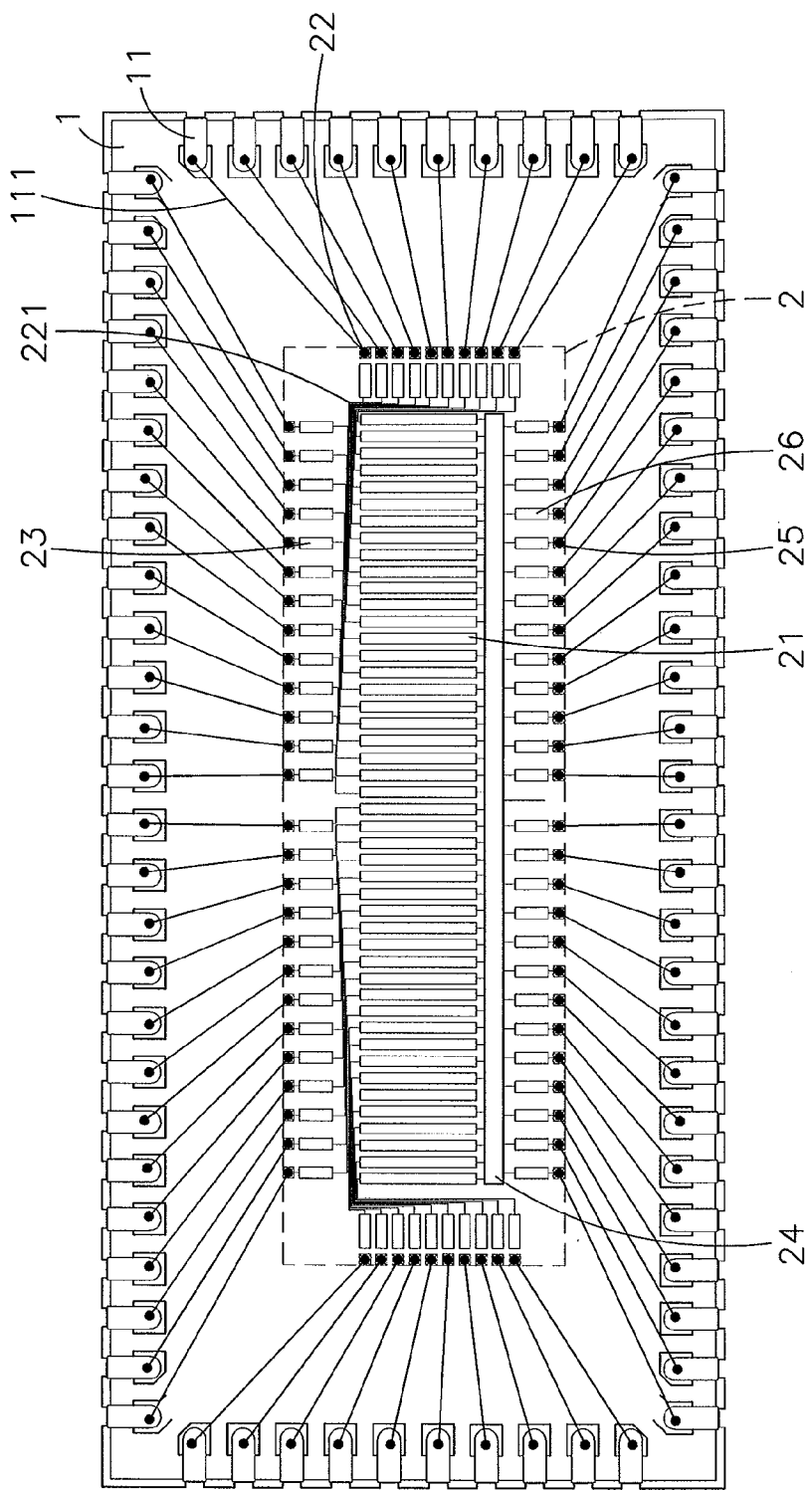
FIG. 1 is a circuit configuration for touch panel controller IC in accordance with a first embodiment of the present invention.
Figure 2:
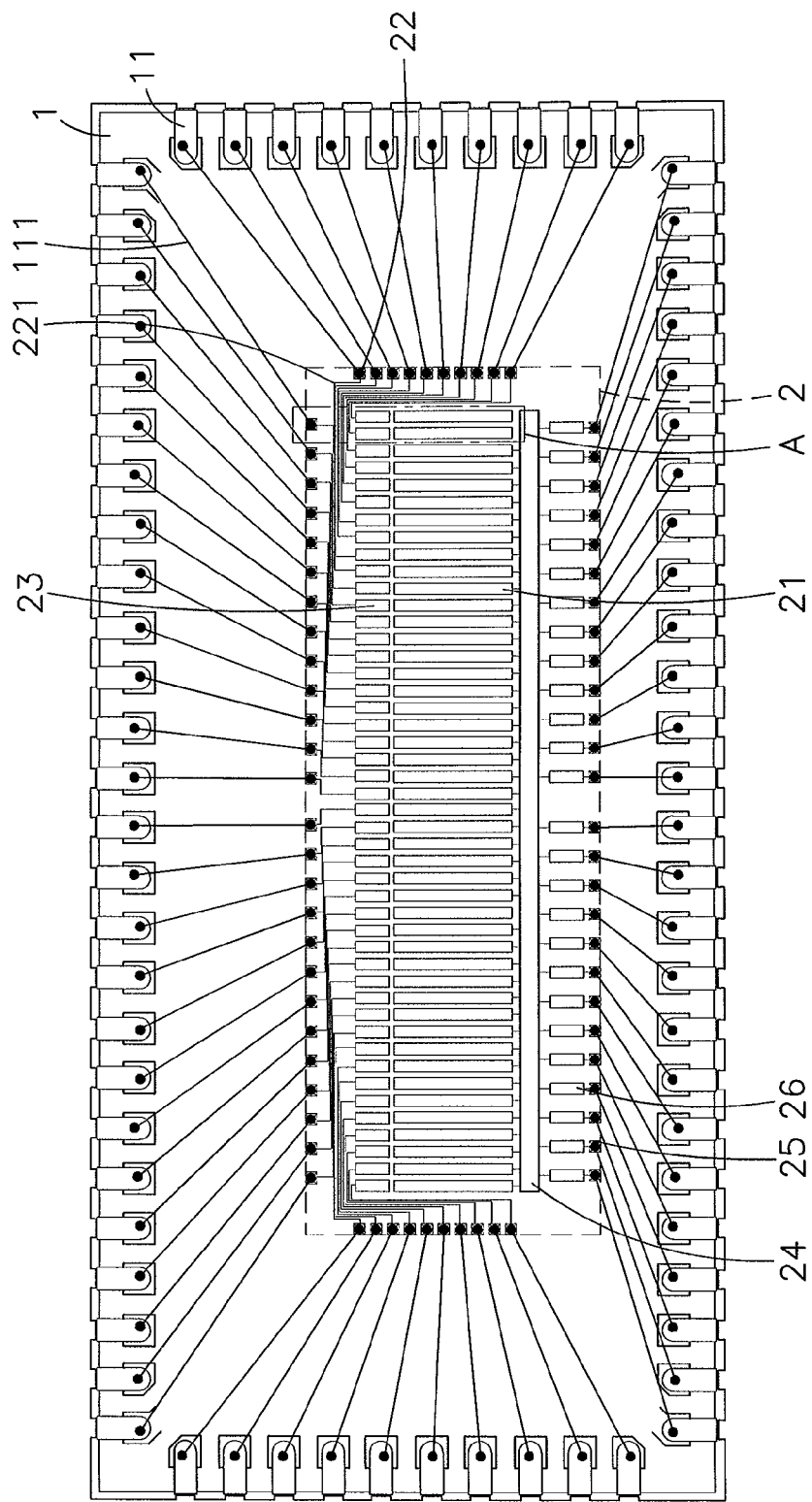
FIG. 2 is a circuit configuration for touch panel controller IC in accordance with a second embodiment of the present invention.

Referring to FIGS. 1 and 2, a circuit configuration for touch panel controller IC in accordance with the present invention is shown. As illustrated, the circuit configuration comprises a substrate 1, a controller 2 made in the form of a chip and mounted on the surface of the substrate 1.

The substrate 1 comprises a plurality of electrode pins 11 arranged along four border edges, namely, the opposing front and rear border edges and the opposing left and right border edges thereof for signal transmission, and a plurality of lead wires 111 respectively extended from the electrode pins 11 toward a center part of the substrate 1.

The controller 2 is mounted on the surface of the substrate 1 and surrounded by the electrode pins 11, comprising a plurality of processing units 21 arranged in one same direction in a parallel manner in the form of a rectangular array that defines opposing front and rear sides and opposing left and right sides, a plurality of first electric contacts 22 arranged in rows along the front, left and right sides around the processing units 21 at an interval larger than the interval between each two adjacent processing units 21 and respectively connected to the processing units 21 and also respectively connected with the respective opposite ends of the lead wires 111 that are respectively connected to the electrode pins 11 at the front, left and right border edges of the substrate 1, a digital processing unit 24 disposed at the rear side relative to the processing units 21 and electrically connected with the processing units 21, and a plurality of second electric contacts 25 arranged in a row along one side of the digital processing unit 24 opposite to the processing units 21 and respectively connected with the respective opposite ends of the lead wires 111 that are respectively connected to the electrode pins 11 at the rear border edge of the substrate 1.

The fabrication of a touch panel controller IC needs to employ development, etch and deposition processes. Because the processing units 21 are arranged in one same direction in a parallel manner, differences in environmental conditions (such as angle or distance) in exposure graphic definition and etch rate can be minimized, obtaining better circuit component process uniformity, and thus, the variation among the processing units 21 after fabrication can be insignificant. Thus, after signal processing, the processing units 21 can produce sensing signals in a consistent manner, enhancing sensing accuracy.

Further, because the processing units 21 are arranged in the same direction in a parallel manner in the form of a rectangular array that defines opposing front and rear sides and opposing left and right sides, and the first electric contacts 22 are arranged in three rows along the front, left and right sides around the processing units 21, the first electric contacts 22 can be arranged at a relatively larger pitch, and thus, the skew angle required for wire-bonding respective lead wires to the electrode pins 11 can be minimized, avoiding erroneous contact between one lead wire and any other adjacent electric contact 22 or electrode pin 11 and further occurrence of short circuits and production of defective products, and therefore, the invention facilitates fabrication and improves the yield.

Further, the first electric contacts 22 can arranged in row at an equal pitch. Alternatively, the first electric contacts 22 can be arranged at different pitches. Further, the first electric contacts 22 at each of the front, left and right sides relative to the processing units 21 can be arranged in a straight, oblique or curved row, or in two or multiple staggered rows. In any arrangement, the first electric contacts 22 must be respectively electrically connected to the processing units 21, and respectively electrically connected to the electrode pins 11 through the respective lead wires 111 without causing erroneous contact between any lead wire 111 and any other adjacent first electric contact 22 or electrode pin 11.

Referring to FIGS. 1 and 2 again, steering lead wires 221 are respectively electrically connected between the processing units 21 and the first electric contacts 22 at the front, left and right sides around the processing units 21. Further, as illustrated in FIG. 2, first input/output units 23 are respectively electrically connected between the processing units 21 and the steering lead wires 221. These first input/output units 23 are arranged in parallel and extend in the same direction relative to the processing units 21. Further, the pitch of the first input/output units 23 is approximately equal to the pitch of the processing units 21. Further, as illustrated in FIG. 1, the first input/output units 23 can also be respectively electrically connected between the first electric contacts 22 and the steering lead wires 221, and arranged in three rows respectively disposed in parallel to the three rows of first electric contacts 22. The pitch of the first input/output units 23 is larger than the pitch of the processing units 21. Further, a plurality of second input/output units 26 are respectively electrically connected between the digital processing unit 24 and the second electric contacts 25 by lead wires, i.e., lead wires are respectively electrically connected between the processing units 21 and the digital processing unit 24, the digital processing unit 24 and the second input/output units 26, and also between the second input/output units 26 and the second electric contacts 25.

The circuit of the aforesaid first input/output units 23 is a known attached circuit design adapted for impedance matching or electrostatic discharge (ESD). The arrangement of the first input/output units 23 is not requisite. However, adding the first input/output units 23 causes a change in the circuit configuration of the touch panel controller IC. Because the circuit design of the first input/output units 23 is the known art, no further detailed description in this regard will be necessary.

Figure 3:
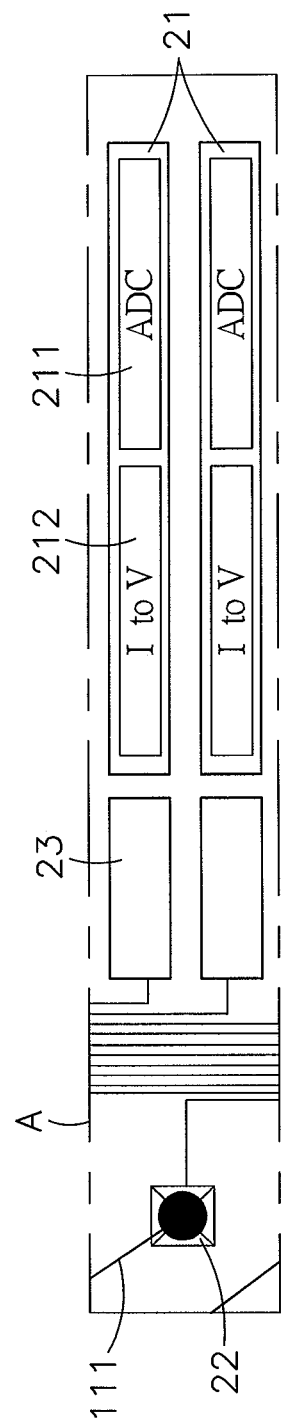
FIG. 3 is a schematic top view, illustrating the arrangement of the controller of the circuit configuration for touch panel controller IC in accordance with the present invention.
Figure 4:
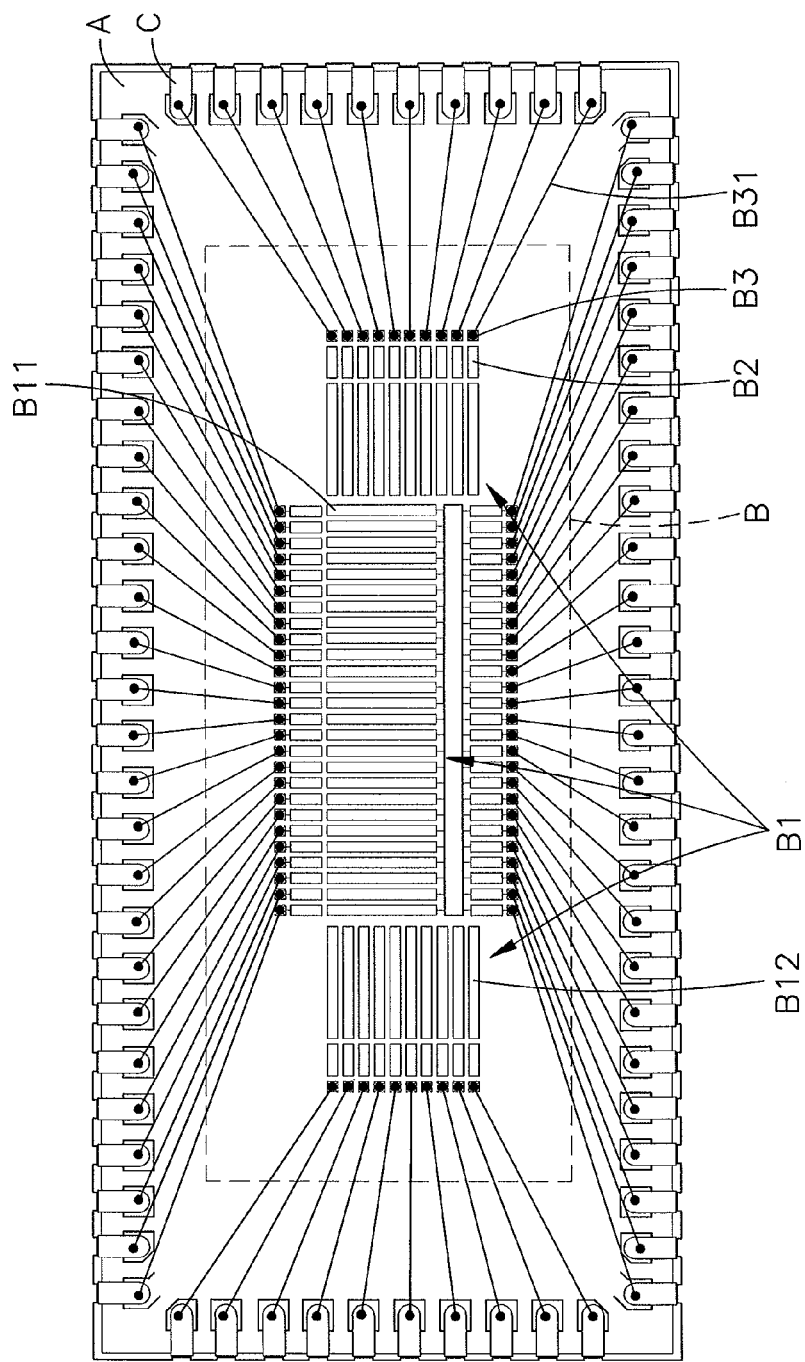
FIG. 4 is a circuit configuration for touch panel controller IC according to the prior art.

Referring to FIG. 3 and FIGS. 1 and 2 again, the processing units 21 are adapted for receiving external touch panel touch signals and converting received analog touch signals into digital signals through analog-to-digital converters 211 thereof, enabling the converted digital signals to be transmitted to an external digital signal processor for further processing. Each processing unit 21 further comprises a current-to-voltage converter 212 electrically connected between the analog-to-digital converter 211 thereof and the respective first electric contact 22 for converting a received current signal into a voltage signal and then transmitting the converted voltage signal to the analog-to-digital converter 211 for processing. As the sensing signals passing through the first electric contact 22 and the first input/output units 23 are current signals, the use of different lengths of steering lead wires 221 to electrically connect the first electric contact 22 or first input/output units 23 to the current-to-voltage converters 212 of the processing units 21 does not cause any signal distortion.

In actual application, the circuit configuration for touch panel controller IC of the present invention exhibits the advantages and features as follows:

1. Because the processing units 21 are arranged in one same direction in a parallel manner, differences in environmental conditions (such as angle or distance) in exposure graphic definition and etch rate can be minimized, obtaining better circuit component process uniformity, and thus, the variation among the processing units 21 after fabrication can be insignificant. Thus, after signal processing, the processing units 21 can produce sensing signals in a consistent manner, enhancing sensing accuracy.

2. Because the processing units 21 are arranged in the same direction in a parallel manner in the form of a rectangular array that defines opposing front and rear sides and opposing left and right sides, and the first electric contacts 22 are arranged in three rows along the front, left and right sides around the processing units 21, the first electric contacts 22 can be arranged at a pitch larger than the pitch of the processing units 21, and thus, the skew angle required for wire-bonding respective lead wires to the electrode pins 11 can be minimized, avoiding erroneous contact between one lead wire and any other adjacent electric contact 22 or electrode pin 11 and further occurrence of short circuits and production of defective products, and therefore, the invention facilitates fabrication and improves the yield. Further, first input/output units 23 can be arranged in three rows and respectively disposed in parallel to the three rows of first electric contacts 22 in such a manner that the pitch of the first input/output units 23 is larger than the pitch of the processing units 21.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A circuit configuration for touch panel controller integrated circuit ("IC"), comprising:
    a substrate comprising a plurality of electrode pins arranged along opposing front and rear border edges and opposing left and right border edges thereof for signal transmission, and a plurality of lead wires respectively extended from said electrode pins toward a center part of said substrate; and
    a controller mounted on said substrate and surrounded by said electrode pins, said controller comprising a plurality of processing units, all of the plurality of processing units being arranged in a single direction in a parallel manner in the form of a rectangular array that defines opposing front and rear sides and opposing left and right sides corresponding to the opposing front and rear border edges and opposing left and right border edges of said substrate, a plurality of electric contacts respectively electrically connected with the respective opposite ends of the lead wires that are respectively connected to the electrode pins at the front, left and right border edges of said substrate, and a plurality of steering lead wires respectively electrically connected between said processing units and said electric contacts, the plurality of electric contacts including first to third parts that are respectively arranged along the front, left and right sides around said processing units, wherein the pitch of the first part of the plurality of electric contacts is larger than pitch of said processing units.

2. The circuit configuration for touch panel controller IC as claimed in claim 1, wherein said controller further comprises a plurality of first input/output units respectively electrically connected between said processing units and said steering lead wires, said first input/output units being arranged in the same direction in a parallel manner relative to said processing units.

3. The circuit configuration for touch panel controller IC as claimed in claim 2, wherein the pitch of said first input/output units is approximately equal to the pitch of said processing units.

4. The circuit configuration for touch panel controller IC as claimed in claim 1, wherein said controller further comprises a plurality of first input/output units respectively electrically connected between said electric contacts and said steering lead wires, said first input/output units being arranged in three rows respectively disposed in parallel to the three rows of said electric contacts.

5. The circuit configuration for touch panel controller IC as claimed in claim 4, wherein the pitch of said first input/output units is larger than the pitch of said processing units.

6. The circuit configuration for touch panel controller IC as claimed in claim 1, wherein each said processing unit comprises therein an analog-to-digital converter adapted for converting an external touch panel analog sensing signal into a digital signal.

7. The circuit configuration for touch panel controller IC as claimed in claim 6, wherein each said processing unit further comprises therein a current-to-voltage converter electrically connected between said analog-to-digital converter and one said electric contact and adapted for converting a current signal into a voltage signal.

8. The circuit configuration for touch panel controller IC as claimed in claim 1, wherein said controller further comprises a digital processing unit disposed a rear side relative to said processing units and electrically connected with said processing units, a plurality of second electric contacts arranged in a row along a rear side of said digital processing unit opposite to said processing units and respectively connected with the respective opposite ends of the lead wires that are respectively connected to the electrode pins at the rear border edge of said substrate, and a plurality of second input/output units respectively electrically connected between said digital processing unit and said second electric contacts.

9. The circuit configuration for touch panel controller IC as claimed in claim 1, wherein
    a first half of the first part of the plurality of electric contacts is arranged adjacent to the second part of the plurality of electric contacts,
    a second half of the first part of the plurality of electric contacts is arranged adjacent to the third part of the plurality of electric contacts,
    a number of the electric contacts in the first half of the first part of the plurality of electric contacts and a number of the electric contacts in the second part of the plurality of electric contacts are equal to a half of a number of the processing units, a number of the electric contacts in the second half of the first part of the plurality of electric contacts and a number of the electric contacts in the third part of the plurality of electric contacts are equal to the half of the number of the processing units, and the number of the electric contacts in the second part of the plurality of electric contacts is equal to the number of the electric contacts in the third part of the plurality of electric contacts.

10. The circuit configuration for touch panel controller IC as claimed in claim 1, wherein numbers of the electric contacts in the first to third parts of the plurality of electric contacts are equal to numbers of electrode pins of the substrate arranged on respective sides of the substrate.

* * * * *